United States Patent
Aoyama

(10) Patent No.: US 6,559,485 B2
(45) Date of Patent: *May 6, 2003

(54) SEMICONDUCTOR DEVICE HAVING A GATE INSULATION FILM RESISTANT TO DIELECTRIC BREAKDOWN

(75) Inventor: Masaaki Aoyama, Kasugai (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/533,869

(22) Filed: Mar. 24, 2000

(65) Prior Publication Data

US 2002/0000579 A1 Jan. 3, 2002

(30) Foreign Application Priority Data

Oct. 6, 1999 (JP) .............................. 11-285303

(51) Int. Cl.$^7$ ............................................. H01L 29/74
(52) U.S. Cl. ...................... 257/211; 257/210; 257/212; 257/758
(58) Field of Search ................................ 257/388, 412, 257/382, 211, 356, 756, 738, 748, 750, 758

(56) References Cited

U.S. PATENT DOCUMENTS

| | | | | |
|---|---|---|---|---|
| 5,014,098 A | * | 5/1991 | Schlais et al. ................ | 357/42 |
| 5,306,938 A | * | 4/1994 | Shirai ........................... | 257/344 |
| 5,342,794 A | * | 8/1994 | Wei .............................. | 437/31 |
| 5,420,449 A | * | 5/1995 | Oji ............................... | 257/307 |
| 5,777,361 A | * | 7/1998 | Parris et al. ................. | 257/314 |
| 5,783,850 A | * | 7/1998 | Liau et al. ................... | 257/355 |
| 5,811,871 A | * | 9/1998 | Nakashima ................. | 257/565 |
| 5,892,258 A | * | 4/1999 | Kobatake .................... | 257/314 |
| 5,965,922 A | * | 10/1999 | Matsui ........................ | 257/369 |
| 5,982,001 A | * | 11/1999 | Wu .............................. | 257/344 |
| 6,037,625 A | * | 3/2000 | Matsubara et al. ......... | 257/314 |
| 6,075,268 A | * | 6/2000 | Gardner et al. ............. | 257/327 |
| 6,087,711 A | * | 7/2000 | Givens ........................ | 257/661 |
| 6,225,697 B1 | * | 5/2001 | Iguchi ......................... | 257/750 |
| 6,278,150 B1 | * | 8/2001 | Okudaira et al. ........... | 257/306 |
| 6,294,834 B1 | * | 9/2001 | Yeh et al. .................... | 257/758 |
| 6,307,229 B2 | * | 10/2001 | Zatelli et al. ................ | 257/321 |

* cited by examiner

Primary Examiner—Wael Fahmy
Assistant Examiner—Nathan W. Ha
(74) Attorney, Agent, or Firm—Armstrong, Westerman & Hattori, LLP

(57) ABSTRACT

A transistor 28a including a first gate electrode 26 is formed on a substrate 10 through a gate insulation film 24. An insulation film 30 is formed on the transistor 28a and the substrate 10. A plurality of first wirings 40a, 40b are formed on the insulation film 30, spaced from each other by a first gap $d_1$. A second wiring 42 is formed, spaced from either of the first wiring 40a, 40b by a second gap $d_2$ which is substantially equal to the first gap $d_1$. Either of the first wirings 40a, 40b is electrically connected to the first gate electrode 26, and the second wiring 42 is electrically connected to the substrate 10.

8 Claims, 8 Drawing Sheets

SEMICONDUCTOR DEVICE HAVING A
GATE INSULATION FILM RESISTANT TO
DIELECTRIC BREAKDOWN

BACKGROUND OF THE INVENTION

1. Field of the Invention

The present invention relates to a semiconductor device and a method for fabricating the same and, more specifically, to a semiconductor device and a method for fabricating the same which can prevent dielectric breakdown of the gate insulation film while allowing micronization of the wiring.

2. Description of the Related Art

Recently micronization of semiconductor devices, as of LSI, etc., has been advanced, and the gate insulation films of field-effect transistors tend to be accordingly thinned.

Thin gate insulation films are vulnerable to electric stresses. The gate insulation films have dielectric breakdown when the gate insulation films are subjected to strong electric stresses.

A factor for causing dielectric breakdown of a gate insulation film has been conventionally considered to be mainly that a high electric stress is applied to the gate insulation film due to inhomogeneity of a plasma for patterning the gate electrode.

However, it has been found that even in a case that the inhomogeneity of a plasma for patterning the gate insulation film is corrected, dielectric breakdown tends to take place in the gate insulation film in fabricating a semiconductor device having a micronized wiring gap.

A semiconductor device fabrication method which causes dielectric breakdown in a gate insulation film will be explained with reference to FIGS. 8A to 8D. FIGS. 8A to 8D are sectional views of a conventional semiconductor device in the steps of the method for fabricating the same, which explain the fabrication method.

As shown in FIG. 8A, first a device isolation film 116 is formed on a semiconductor substrate 110. Then, a gate insulation film 124 is formed in device regions defined by the device isolation film 116. Next, gate electrodes 126 are formed on the gate insulation film 124. A source/drain diffused layer (not shown) is formed by self-alignment with the gate electrodes 126, and transistors 128 each having the gate electrodes 126 and the source/drain diffused layer are formed.

Next, an inter-layer insulation film 130 is formed on the entire surface, and contact holes 132 which arrive at the gate electrodes 126 are formed. Then, a wiring material film 144 is formed. Next, a photoresist mask 146 for forming a wiring is formed on the wiring material film 144.

Then, the wiring material layer 144 is etched with the photoresist mask 146 as a mask. In this etching, although no special problem takes place in a semiconductor device having a large pattern gap, the microloading effect that an etching rate is decreased in regions having a smaller pattern gap takes place in a micronized semiconductor device having a smaller pattern gap. At this time, positive electrons are accelerated by a sheath electric field on the substrate surface to be incident substantially vertically to the semiconductor substrate 110, while electrons are decelerated by the sheath electric field to be incident at an angle to the semiconductor substrate 110. Accordingly, in regions where the photoresist mask 146 has a smaller pattern gap, more electrons are incident on the side surfaces of the photoresist mask 146, and more positive electrons are incident on the wiring material film 144 (see FIG. 8B).

As the etching advances, the photoresist mask 146, on which more electrons have been incident, is charged negative, and the wiring material film 144, on which more positive electrons have been incident, is charged positive. Thus, a positive charge is charged up in the wiring material film 144 and the gate electrodes 126.

The charge-up advances, and when a voltage which exceeds a voltage resistance of the gate insulation film 124 between the semiconductor substrate 110 and the gate electrodes 126, dielectric breakdown takes place in the gate insulation film 124 to discharge the positive electric charge to the side of the semiconductor substrate 110 (see FIG. 8C).

Then, in order to prevent such charge-up damage, a technique in which protection diodes are inserted between the gate electrodes 126 and the semiconductor substrate 110 is proposed. The insertion of the protection diodes between the gate electrodes 126 and the semiconductor substrate 110 can make small a potential difference between the gate electrodes 126 and the semiconductor substrate 110. The occurrence of the dielectric breakdown in the gate insulation film 124 can be thus precluded.

However, it is difficult to connect all the gate electrodes to the protection diodes, thereby hindering higher integration of the semiconductor device.

From the viewpoint that the charge-up damage tends to take place in wirings having higher antenna ratios, which are values given by dividing a wiring area by a gate area, it is considered that the protection diodes are connected only to wirings having higher antenna ratios. However, it is not easy to determine those of the gate electrodes to be connected to the protection diodes, based on antenna ratios computed from design data, etc.

SUMMARY OF THE INVENTION

An object of the present invention is to provide a semiconductor device and a method for fabricating the same which can prevent dielectric breakdown of the gate insulation film.

The above-described object is achieved by a semiconductor device comprising: a first transistor including a first gate electrode formed on a substrate through a first gate insulation film; a first insulation film formed on the first transistor and the substrate; a plurality of first wirings formed on the first insulation film, spaced from each other by a first gap; and a second wiring formed on the first insulation film, spaced from either of the first wirings by a second gap which is substantially equal to the first gap, either of the first wirings being electrically connected to the first gate electrode, the second wiring being electrically connected to the substrate. The second wiring is formed on the first insulation film, spaced from the first wiring by a gap which is substantially equal to a first gap, whereby the first wirings and the second wiring can be kept connected up to a certain timing. Furthermore, the second wiring is connected to the substrate, and the first wiring is connected to the first gate electrode of the first transistor, whereby even when the first wiring and the second wiring are charged up with an electric charge, an electric field applied to the first gate insulation film can be small, and dielectric breakdown of the first gate insulation film can be precluded.

The above-described object is achieved by a method for fabricating the semiconductor device comprising the steps of: forming a transistor including a gate electrode formed through a gate insulation film on a substrate; forming an insulation film on the substrate and the transistor; forming a wiring material film on the insulation film; and etching the wiring material film to form first wirings at least either of which is electrically connected to the gate electrode, and a second wiring electrically connected to the substrate, in the step of etching the wiring material film, the second wiring being formed, spaced from either of the first wirings by a second gap which is substantially equal to a first gap by which the first wirings are spaced from each other. The second wiring is formed on the first insulation film, spaced from the first wiring by a gap which is substantially equal to a first gap, whereby the first wirings and the second wiring can be kept connected up to a certain timing. Furthermore, the second wiring is connected to the substrate, and the first wiring is connected to the gate electrode, whereby even when the first wiring and the second wiring are charged up with an electric charge, an electric field applied to the gate electrode can be small, and dielectric breakdown of the gate insulation film can be precluded.

The above-described object is achieved by a method for fabricating the semiconductor device comprising the steps of: forming a transistor including a gate electrode formed through a gate insulation film on a substrate; forming an insulation film on the substrate and the transistor; forming a first conductor plug buried in the insulation film electrically connected to the gate electrode, and a second conductor plug buried in the insulation film electrically connected to the substrate; forming a wiring material film on the first conductor plug, the second conductor plug and the insulation film; and etching the wiring material film to form a first wiring connected to the first conductor plug, and a second wiring connected to the second conductor plug, in the step of etching the wiring material film, the wiring material film being etched in state where the first conductor plug and the second conductor plug are electrically connected to each other through the wiring material film.

As described above, according to the present invention, because the dummy wiring is formed, spaced from the wiring by a gap which is substantially equal to a gap between the wiring and its adjacent one, the wirings and the dummy wiring can be kept connected to each other up to a certain timing. Furthermore, a part of the wiring material film corresponding to the dummy wiring is connected to the substrate, and a part of the wiring material film corresponding to the wirings are connected to the gate electrodes of the transistors, whereby even when the wiring material film is charged up with a positive electric charge, an electric field applied to the gate insulation film can be small, and dielectric breakdown of the gate insulation film can be prevented.

In addition, according to the present invention, dielectric breakdown of the gate insulation film of the transistors can be precluded not only when a first layer wiring is formed, but also when a second layer wiring is formed.

Furthermore, according to the present invention, dielectric breakdown of the gate insulation film of the transistors can be prevented not only when the second layer wiring is formed, but also when a third layer wiring is formed.

DETAILED DESCRIPTION OF THE INVENTION

A First Embodiment

Figure 1A:
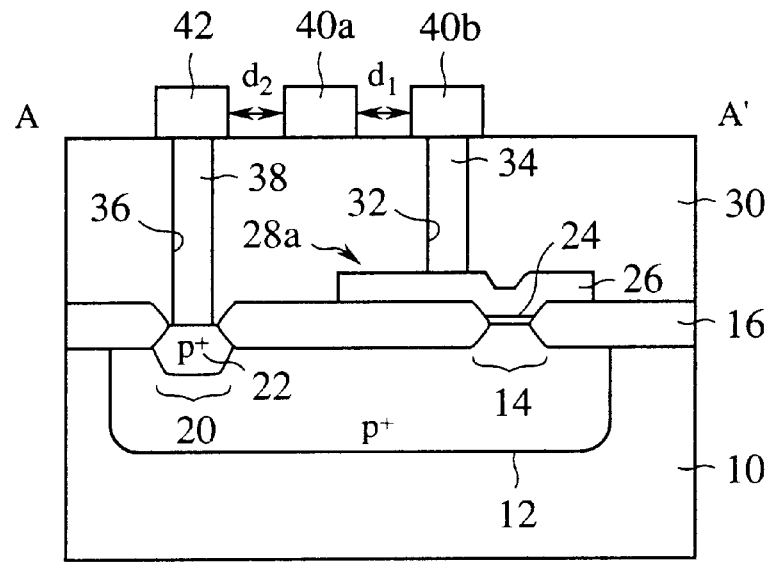
FIG. 1A is a sectional view of the semiconductor device according to a first embodiment of the present invention.
Figure 1B:
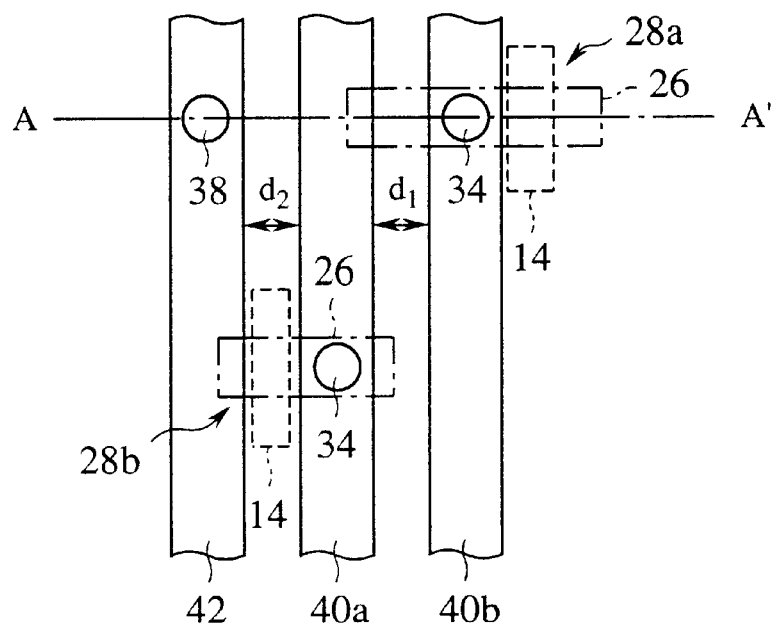
FIG. 1B is a plan view of the semiconductor device according to a first embodiment of the present invention.

The semiconductor device according to a first embodiment of the present invention and the method for fabricating the same will be explained with reference to FIGS. 1A to 5B. FIG. 1A is a sectional view of the semiconductor device according to the present embodiment. FIG. 1B is a plan view of the semiconductor device according to the present embodiment. FIG. 1A is a sectional view along the line A–A' in FIG. 1B. FIGS. 2A to 4B are sectional views of the semiconductor device according to the present embodiment in the steps of the method for fabricating the semiconductor device, which explain the method. FIG. 5A is a sectional view of the semiconductor device having a larger gap between the wiring and dummy wiring. FIG. 5B is a plan view of the semiconductor device having a larger gap between the wiring and dummy wiring.

Semiconductor Device

As shown in FIG. 1A, a well 12 heavily doped with a p type impurity is formed in a semiconductor substrate 10. A device isolation film 16 for defining a device region 14 and a contact region 20 is formed on the semiconductor substrate 10 with the well 12 formed in.

A gate insulation film 24 is formed on the surface of the device region 14 on the semiconductor substrate 10, and gate electrodes 26 are formed on the gate insulation film 24. A source/drain diffused layer (not shown) is form on the semiconductor substrate 10 on both sides of the gate electrodes 26 by self-alignment with the gate electrodes 26. Thus, transistors 28a, 28b, each having source/drain diffused layer and the gate electrode 26, are thus formed as shown in FIG. 1B.

A contact layer 22 heavily doped with a p-type impurity is formed in the contact region 20 defined by the device isolation film 16.

An inter-layer insulation film 30 is formed on the entire surface of the semiconductor substrate 10 with the transistors 28a, 28b formed on. Contact holes 32 reaching the gate electrodes 26 are formed in the inter-layer insulation film 30. Conductor plugs 34 are buried in the contact holes 32. A contact hole 36 arriving at the contact layer 22 is formed in the inter-layer insulation film 30. A conductor plug 38 is buried in the contact hole 36.

A wiring 40a and a wiring 40b are formed on the inter-layer insulation film 30 with the conductor plugs 34, 38 buried in. The wiring 40a is connected to the gate electrode 26 of the transistor 28b, and the wiring 40b is connected to the gate electrode 26 of the transistor 28a.

A dummy wiring 42 is formed on the inter-layer insulation film 30. The dummy wiring 42 is connected to the contact layer 22 through the conductor plug 38 and is connected to the well 12 through the contact layer 22. The dummy wiring 42 is not especially connected to the semiconductor elements, such as the transistors.

A gap $d_1$ between the wiring 40a and the wiring 40b is set to be substantially equal to a gap $d_2$ between the dummy wiring 42 and the wiring 40a.

The semiconductor device according to the present embodiment is characterized mainly in that a gap $d_1$ between the wiring 40a and the wiring 40b is set to be substantially equal to a gap $d_2$ between the dummy wiring 42 and the wiring 40a, and the dummy wiring is connected to the substrate.

Because a gap $d_1$ between the wiring 40a and the wiring 40b and a gap $d_2$ between the dummy wiring 42 and the wiring 40a are set to be substantially equal to each other, it is possible that the wiring material film is separated by substantially concurrently being patterned to be the wirings 40a, 40b, and the dummy wiring 42.

Accordingly, even when the wiring material film is charged up with an electric charge due to the microloading effect, occurrence of a large potential difference between the gate electrode 26 of the transistor 28a and the well 12 can be prevented, whereby dielectric breakdown of the gate insulation film of the transistor 28a can be precluded.

As shown in FIG. 1B, it is preferable that the dummy wiring 42 is extended along the wiring 40a, but it is not necessary that a up-to-down length of the dummy wiring 42 as viewed in the drawing is almost equal to a up-to-down length of the wiring 40a as viewed in the drawing. When the up-to-down length of the dummy wiring 42 in the drawing is more than three times as the gap $d_2$, the dummy wiring 42 and the wirings 40a, 40b can be kept connected to each other during etching the wiring material film 44.

Thus, even in a micronized semiconductor device according to the present embodiment, dielectric breakdown of the gate insulation film can be prevented, and the semiconductor device can be highly reliable. The microloading effect tends to occur for a wiring gap $d_1$ of below 1 μm. The semiconductor device according to the present embodiment is especially effective for a wiring gap $d_1$ of below 1 μm. Accordingly a wiring gap $d_2$ is set also to be less than 1 μm.

Method for Fabricating the Semiconductor Device

Next, the method for fabricating the semiconductor device according to the present embodiment will be explained with reference to FIGS. 2A to 5B.

First, a p type impurity is introduced into a semiconductor substrate 10 by ion implantation to form the p-well 12.

Then, the device isolation film 16 for defining the device region 14 and the contact region 20 is formed by LOCOS (Local Oxidation of Silicon).

Then, the gate insulation film 24 is formed on the surface of the semiconductor substrate 10 by thermal oxidation. Then, the gate electrodes 26 of polysilicon are formed (see FIG. 2A).

Next, an n type impurity is introduced into the semiconductor substrate 10 by self-alignment with the gate electrode 26 to form the source/drain diffused layer (not shown) on both sides of the gate electrodes 26.

Figure 2A:
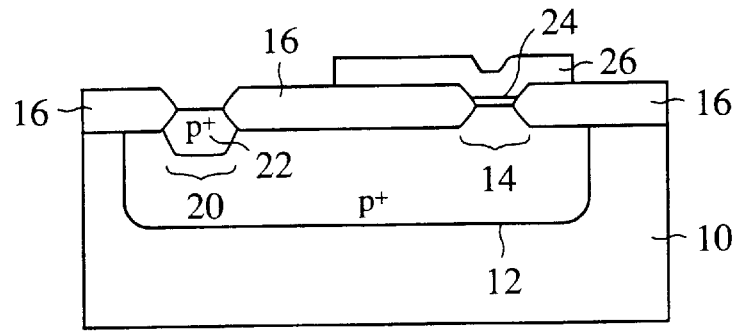
FIGS. 2A to 2C are sectional views of the semiconductor device according to the first embodiment of the present invention in the steps of the method for fabricating the same, which show the method (Part 1).
Figure 2B:
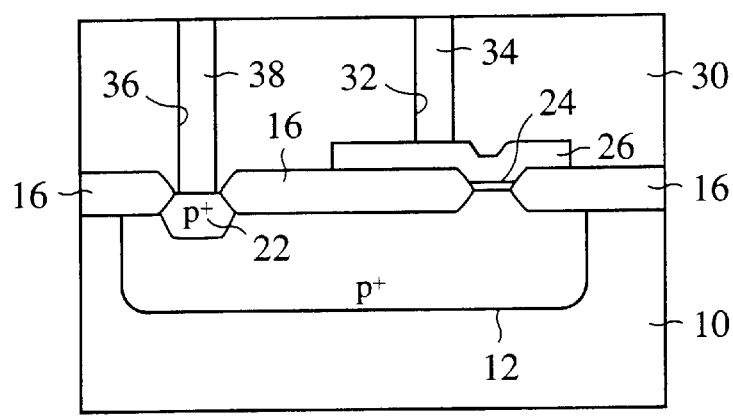

Then, a p type impurity is heavily introduced into the contact region 20 to form the contact layer 22 (see FIG. 2A).

Then, the inter-layer insulation film 30 of about 1 μm-film thickness BPSG (Boro-Phospho-Silicate Glass) is formed on the entire surface by CVD (Chemical Vapor Deposition).

Then, the contact holes 32 arriving at the gate electrodes 26, and the contact hole 36 reaching the contact layer 22 are formed in the inter-layer insulation film 30.

Next, the wiring material film of about 400 nm-film thickness tungsten is formed on the entire surface by CVD. Next, the wiring material film is polished by CMP (Chemical Mechanical Polishing) until the surface of the inter-layer insulation film 30 is exposed. Thus, the conductor plugs 34, 38 are formed respectively in the contact holes 32 and the contact hole 36 (see FIG. 2B).

Figure 2C:
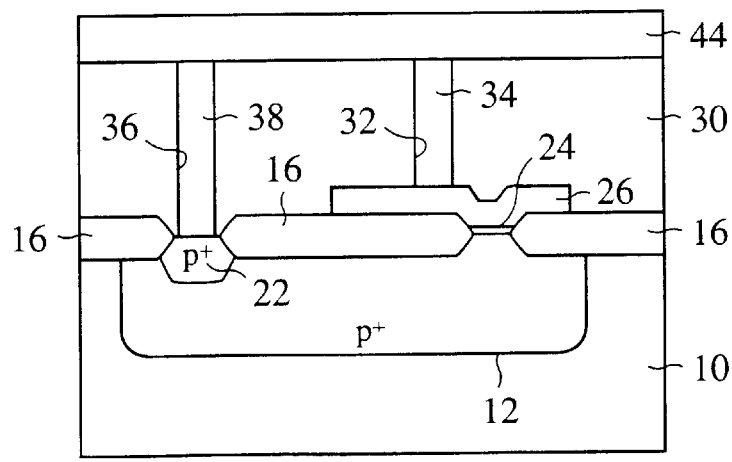
Figure 3A:
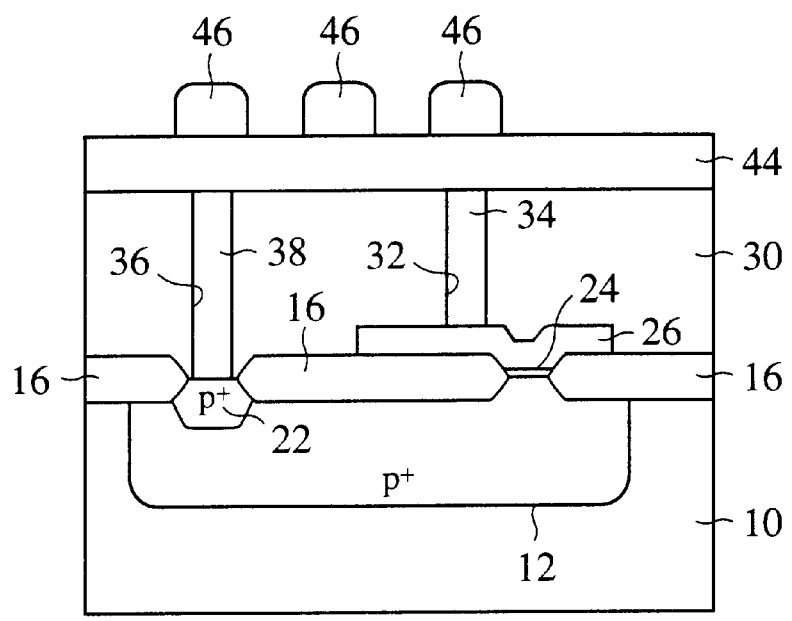
FIGS. 3A and 3B are sectional views of the semiconductor device according to the first embodiment of the present invention in the steps of the method for fabricating the same, which show the method (Part 2).
Figure 3B:
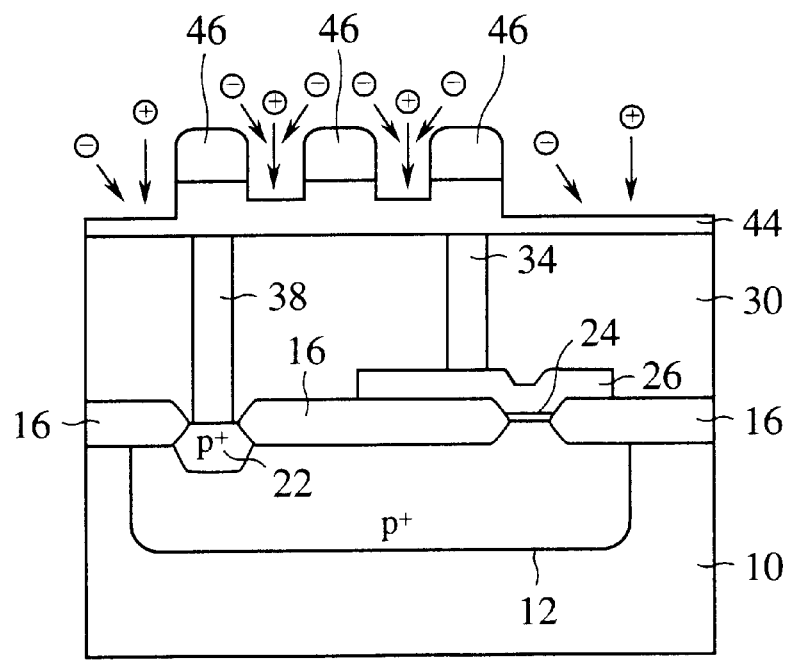

Then, the wiring material film 44 of Al is formed of about 400 nm-film thickness Al on the entire surface by sputtering (see FIG. 2C).

Then, a photoresist film is formed on the entire surface by spin coat. Then, a photoresist mask 46 for forming the wirings 40a, 40b, and the dummy wiring 42 is formed by photolithography (see FIG. 3A).

Then, with the photoresist mask 46 as a mask, the wiring material film 44 is dry-etched. When the wiring material film 44 is etched, the microloading effect that an etching rate is decreased in a region where a pattern gap of the photoresist mask 46 is smaller takes place. At this time, positive ions are accelerated by a sheath electric field on the surface of the substrate to be incident substantially vertically to the semiconductor substrate 10, while electrons are decelerated by the sheath electric field to be incident slantly to the semiconductor substrate 10. Accordingly, more electrons are incident on the side surfaces of the photoresist mask 46 in the region where the photoresist mask 46 has a narrower pattern gap, and more positive ions are incident on the wiring material film 44 (see FIG. 3B).

As the etching advances, the photoresist mask 46, on which more electrons have been incident, is charged negative, and the wiring material film, on which positive ions have been incident, is charged positive. Thus, the wiring material film 44 is charged up with a positive electric charge.

In the present embodiment, a gap $d_1$ between the wiring 40a and the wiring 40b and a gap $d_2$ between the wiring 40a and the dummy wiring 42 are set to be substantially equal to each other, whereby the wirings 40a, 40b and the dummy wiring 42 are kept connected to each other up to a certain timing. Furthermore, the portion of the wiring material film 44 corresponding to the dummy wiring 42 is connected to the well 12 through the conductor plug 38, etc., and the portion of the wiring material film 44 corresponding to the wiring 40b is connected to the gate electrode 26 of the transistor 28a through the conductor plug 34. Accordingly, in the present embodiment, even when the wiring material film 44 is charged up with a positive electric charge, a potential difference between the gate electrode 26 and the well 12 of the transistor 28a can be made small, whereby dielectric breakdown of the gate insulation film 24 can be precluded.

Figure 4A:
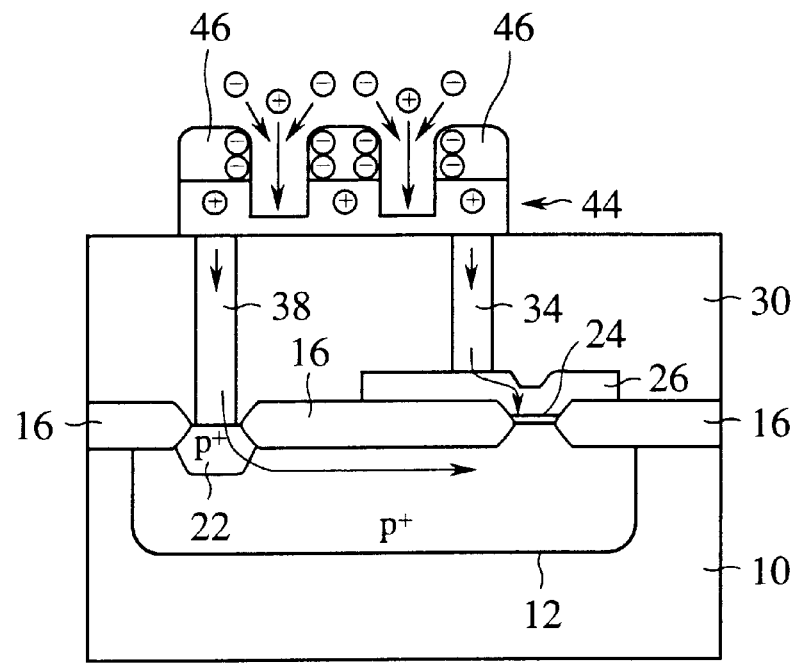
FIGS. 4A and 4B are sectional views of the semiconductor device according to the first embodiment of the present invention in the steps of the method for fabricating the same, which show the method (Part 3).
Figure 4B:
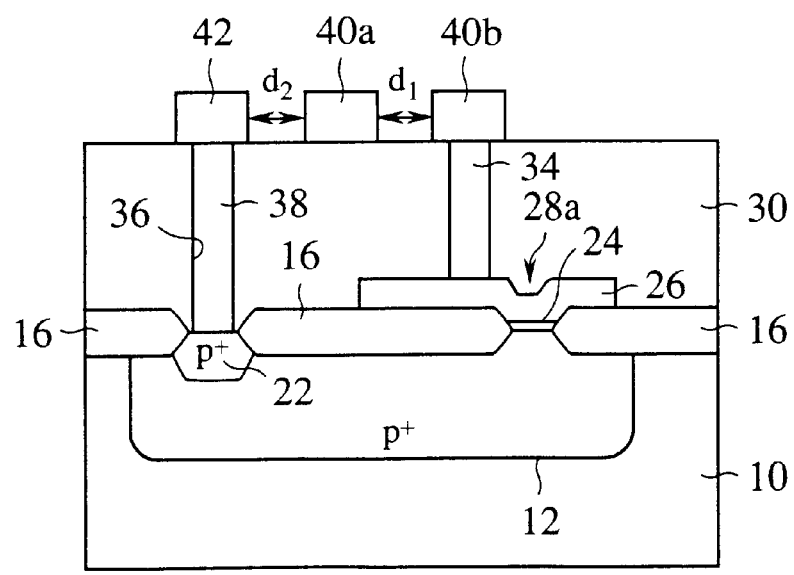
Figure 5A:
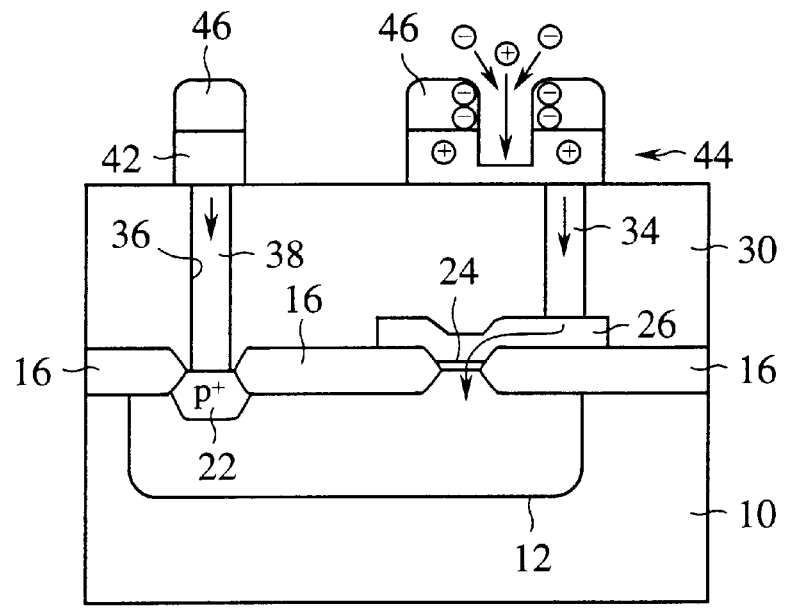
FIG. 5A is a sectional view of a semiconductor device in which the dummy wiring is spaced from the wiring by a larger gap.
Figure 5B:
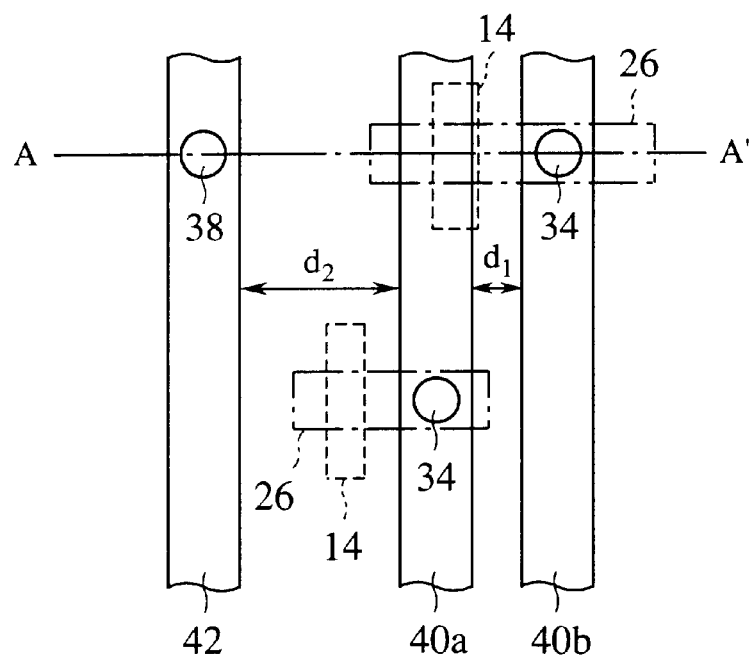
FIG. 5B is a plan view of a semiconductor device in which the dummy wiring is spaced from the wiring by a larger gap.

Thus, even in making the micronized semiconductor device having a narrow wiring gap is fabricated, dielectric breakdown of the gate insulation film can be precluded, and the semiconductor device can be highly reliable (see FIG. 4B).

In a case as shown in FIG. 5B that a gap $d_2$ between the wiring 40a and the dummy wiring 42 is larger than a gap $d_1$ between the wiring 40a and the wiring 40b, an etching rate increases in a region where a pattern gap is larger, and the dummy wiring 42 is sooner separated from the wiring material film 44. Accordingly, when the wiring material film 44 is charged up with a positive electric charge by the microloading effect, a large potential difference takes place between the gate electrode 26 and the well 12. This causes dielectric breakdown in the gate insulation film 24. Accordingly, it is preferable to set a gap $d_1$ between the wiring 40a and the wiring 40b and a gap $d_2$ between the wiring 40a and the dummy wiring 42 to be equal to each other as shown in FIG. 1B.

As described above, according to the present embodiment, the dummy wiring is formed separate from the wiring at a gap which is substantially equal to a gap between the wirings, whereby the wirings and the dummy wiring can be kept connected to each other up to a certain timing. Furthermore, the portion of the wiring material film corresponding to the dummy wiring is connected to the substrate, and the portions of the wiring material film corresponding to the wirings are connected to the gate electrodes of the transistors, whereby even when the wiring material film is charged up with a positive electric charge, an electric field to be applied to the gate insulation film can be small, and accordingly dielectric breakdown of the gate insulation film can be precluded.

A Second Embodiment

Figure 6:
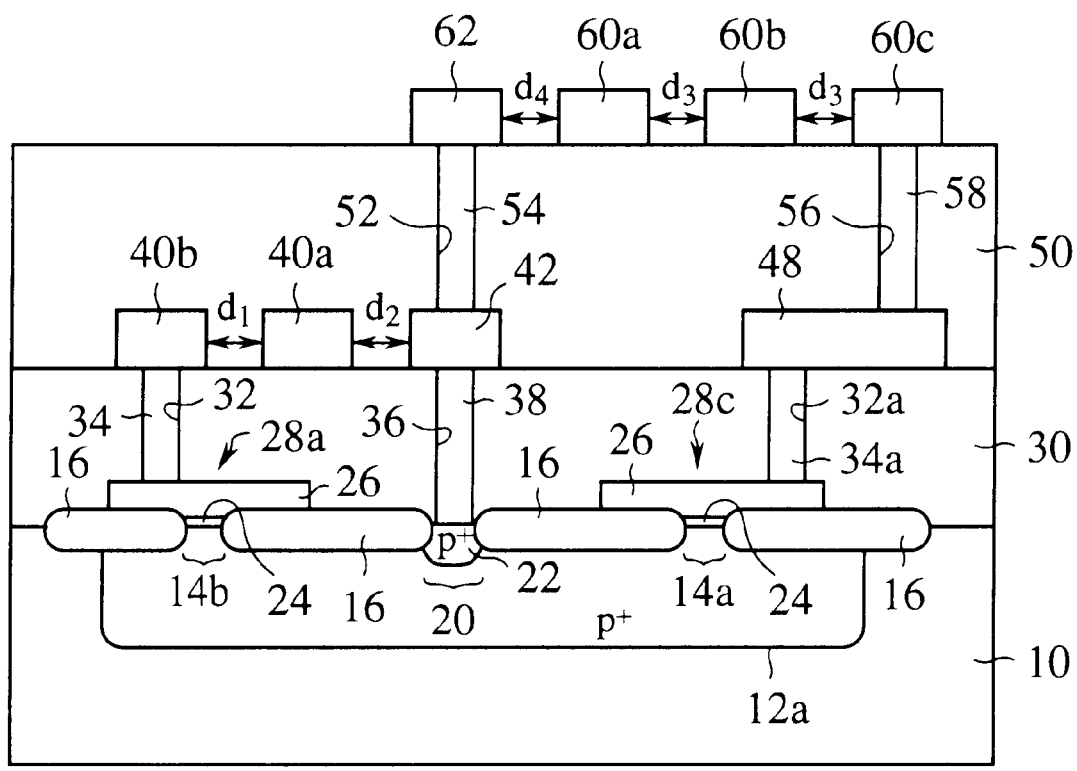
FIG. 6 is a sectional view of the semiconductor device according to a second embodiment of the present invention.

The semiconductor device according to a second embodiment of the present invention will be explained with reference to FIG. 6. FIG. 6 is a sectional view of the semiconductor device according to the present embodiment. The same members of the present embodiment as those of the semiconductor device according to the first embodiment shown in FIGS. 1A to 5B are represented by the same reference numbers not to repeat or to simplify their explanation.

As shown in FIG. 1A, a well 12a heavily doped with a p type impurity is formed in a semiconductor substrate 10. A device isolation film 16 for defining device regions 14a, 14b and a contact region 20a is formfed on the semiconductor substrate 10 with the well 12a formed in.

A transistor 28a formed in the device region 14 is the same as the transistor 28a explained in the first embodiment, and will not be explained here.

A transistor 28a which is the same as the transistor 28a is formed also in the device regions 14a.

An inter-layer insulation film 30 is also formed on the semiconductor substrate 10 with the transistors 28a, 28c formed on as is in the first embodiment.

A contact hole 32 reaching the gate electrode 26 of the transistor 28a is formed in the inter-layer insulation film 30 as is formed in the first embodiment, and a conductor plug 34 is buried in the contact hole 32.

A contact hole 32a arriving at the gate electrode 26 of the transistor 28c is also formed in the inter-layer insulation film 30, and a conductor plug 34a is buried in the contact hole 32a.

A p-contact layer 22 is formed in the contact region 20 as is in the first embodiment. A contact hole 36 reaching the contact layer 22 is formed in the inter-layer insulation film 30. A conductor plug 38 is formed in the contact hole 36.

On the inter-layer insulation film 30 with the conductor plugs 32, 32a, 38 buried in there are formed a first layer wiring, i.e., wirings 40a, 40b and a dummy wiring 42 as are formed as in the first embodiment. As in the first embodiment, a gap $d_1$ between the wiring 40a and the wiring 40b is set to be substantially equal to a gap $d_2$ between the dummy wiring 42 and the wiring 40a.

Accordingly, as explained in the first embodiment, dielectric breakdown of the gate insulation film 24 can be precluded when the wirings 40a, 40b are formed.

A wiring 48 connected to the conductor plug 32a is formed on the inter-layer insulation film 30.

An inter-layer insulation film 50 is formed on the inter-layer insulation film 30 with the wirings 40a, 40b, 48 and the dummy wiring 42 formed on.

A contact hole 52 arriving at the dummy wiring 42 is formed in the inter-layer insulation film 50. A conductor plug 54 is buried in the contact hole 52. A contact hole 56 reaching the wiring 48 is formed in the inter-layer insulation film 50, and a conductor plug 58 is formed in the contact hole 56.

On the inter-layer insulation film 50 with the conductor plug 54 and the conductor plug 58 buried in there are formed a second layer wiring, i.e., a wiring 60a, a wiring 60b and a wiring 60c, and a dummy wiring 62. Gaps $d_3$ between the wiring 60a and the wiring 60b and between the wiring 60b and the wiring 60c are set to be substantially equal to a gap $d_4$ between the dummy wiring 62 and the wiring 60a.

In the present embodiment, because the gap $d_3$ and the gap $d_4$ are substantially equal to each other, when the wiring material film is patterned to from the wirings 60a, 60b, 60c and the dummy wiring 62, the wiring material film is separated substantially at the same timing to form the wirings 60a, 60b, 60c, and the dummy wiring 62. Furthermore, the wiring 60c is connected to the gate electrode 26 of the transistor 28c through the conductor plug 58, etc. The dummy wiring 62 is connected to the substrate through the conductor plug 54, the dummy wiring 42, etc.

Accordingly, in the present embodiment, as dielectric breakdown of the gate insulation film of the transistor 28a can be precluded when the wirings 40a, 40b are formed, dielectric breakdown of the gate insulation film 24 of the transistor 28c can be prevented also when the wirings 60a, 60b, 60c are formed. The microloading effect tends to occur when a wiring gap $d_3$ is less than 1 μm, and the present embodiment is especially effective in a case that a wiring gap $d_3$ is, e.g., less than 1 μm. Accordingly, a gap $d_4$ is also set to be, e.g., less than 1 μm.

As described above, according to the present embodiment, dielectric breakdown of the gate insulation film of the transistors can be prevented not only when the first layer wirings are formed, but also when the second layer wirings are formed.

The semiconductor device according to the present embodiment can be fabricated by the same method as the method for fabricating the semiconductor device according to the first embodiment and by suitably forming the conductor plugs 52, 56, the wirings 60a, 60b, 60c, the dummy wiring 62, etc.

A Third Embodiment

Figure 7:
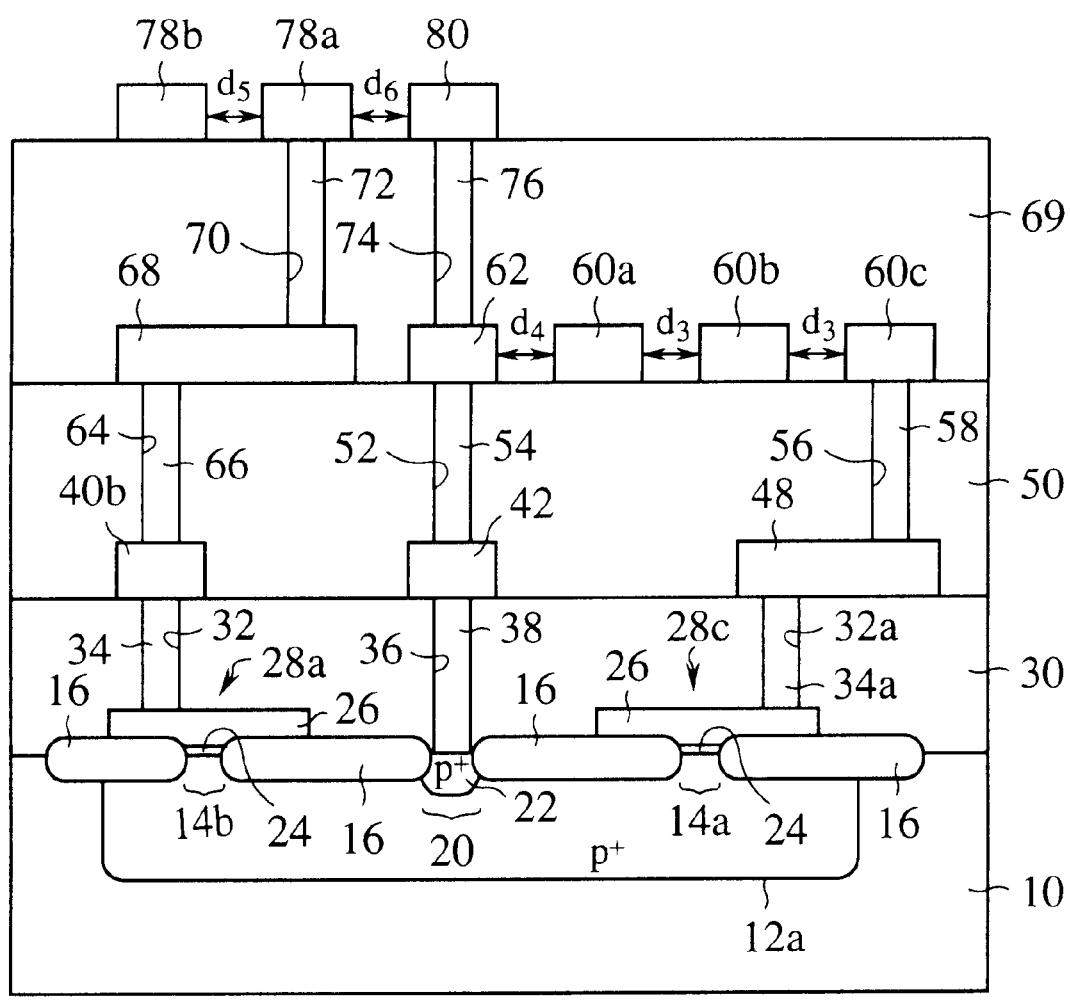
FIG. 7 is a sectional view of the semiconductor device according to a third embodiment of the present invention.
Figure 8A:
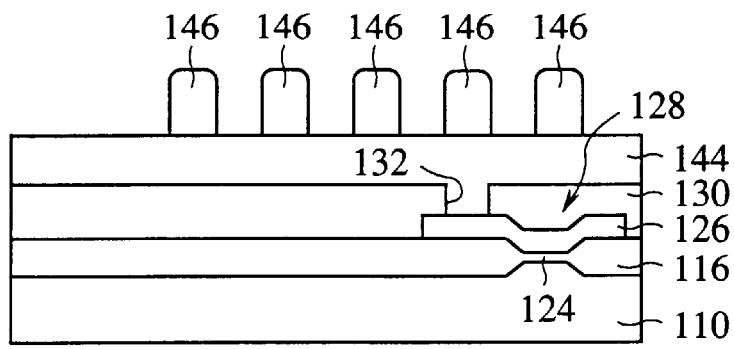
FIG. 8A to 8D are sectional views of the method for fabricating the conventional semiconductor device.
Figure 8B:
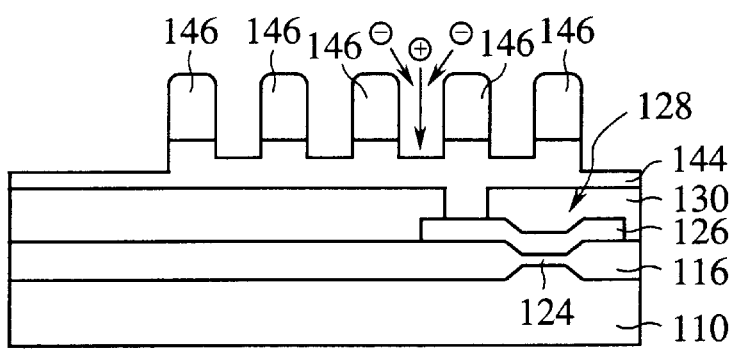
Figure 8C:
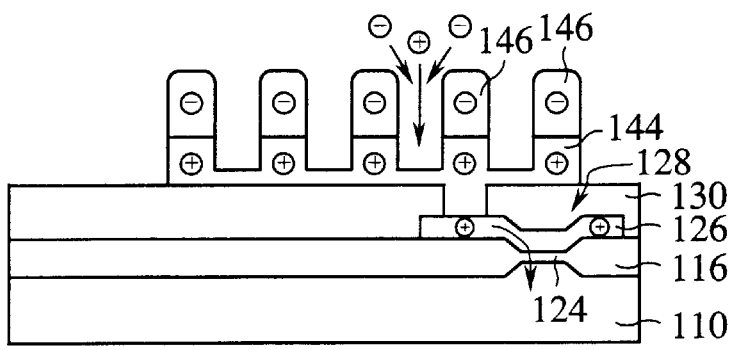
Figure 8D:
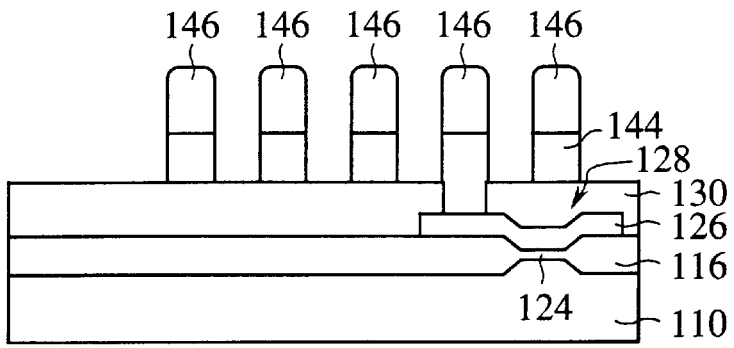

The semiconductor device according to a third embodiment of the present invention will be explained with reference of FIG. 7. FIG. 7 is a sectional view of the semiconductor device according to the present embodiment, which shows the semiconductor device. The same members of the present embodiment as those of the semiconductor device according to the first and the second embodiments are represented by the same reference numbers to simplify or not to repeat their explanation.

The structure of the semiconductor device according to the present embodiment which is below an inter-layer insulation film 30 with conductor plugs 34, 36, 34a buried in is the same as that of the semiconductor device according to the second embodiment, and the explanation of the structure will not be repeated here.

On the inter-layer insulation film 30 with the conductor plugs 34, 34a, 38 buried in there are formed, as in the second embodiment, a wiring 40b connected to the conductor plug 34, a wiring 48 connected to the conductor plug 34a, and a dummy wiring 42 connected to the conductor plug 38. As in the second embodiment, an inter-layer insulation film 50 is formed on the entire surface of the inter-layer insulation film 30 with the wirings 40b, 48 and the dummy wiring 42 formed on.

As in the second embodiment, a conductor plug 54 connected to the dummy wiring 42, and a conductor plug 58 connected to the wiring 48 are buried in the inter-layer insulation film 50. A contact hole 64 arriving at the wiring 40b is formed in the inter-layer insulation film 50, and a conductor plug 66 is buried in the contact hole 64.

As in the second embodiment, a second layer wiring, i.e., wiring 60a, 60b, 60c and a dummy wiring 62 are formed on the inter-layer insulation film 50 with the conductor plugs 54, 58, 66 buried in. Accordingly, as explained in the second embodiment, dielectric breakdown of the gate insulation film 24 of the transistor 28c can be prevented when the wirings 60, 60a, 60b, 60c are formed.

A wiring 68 is formed on the inter-layer insulation film 40.

An inter-layer insulation film 69 is formed on the inter-layer insulation film 50 with the wirings 60a, 60b, 60c, the wiring 68 and the dummy wiring 62 formed on.

A contact hole 70 arriving at the wiring 68 is formed in the inter-layer insulation film 69, and a conductor plug 72 is buried in the contact hole 70. A contact hole 74 reaching the dummy wiring 62 is formed in the inter-layer insulation film 69, and a conductor plug 76 is buried in the contact hole 74.

A third layer wiring, i.e., a wiring 78a, a wiring 78b, and a dummy wiring 80 are formed in the inter-layer insulation film 69 with the conductor plugs 72, 76 buried in. A gap $d_5$ between the wirings 78a, 78b is set to be substantially equal to a gap $d_6$ between the dummy wiring 80 and the wiring 78a.

In the present embodiment, because a gap $d_5$ and a gap $d_6$ are substantially equal to each other, when a wiring material film is patterned to form the wrings 78a, 78b and the dummy wiring 80 are formed, the wiring material film is separated substantially at the same timing to form the wirings 78a, 78b and the dummy wiring 80. Furthermore, the wiring 78a is connected to the gate electrode 26 of the transistor 28a through the conductor plug 72, etc., and the dummy wiring 80 is connected to the substrate through the conductor plug 76, the dummy wiring 62, etc.

Accordingly, according to the present embodiment, dielectric breakdown of the gate insulation film of the transistor 28c can be precluded when the second layer wiring, i.e., the wirings 60a, 60b, 60c are formed, and when the third layer wiring, i.e., the wirings 78a, 78b are formed, dielectric breakdown of the gate insulation film 24 of the transistor 28a can be prevented. The microloading effect tends to occur when a wiring gap $d_4$ is less than 1 μm, and the present embodiment is effective especially in a case that a wiring gap $d_4$ is, e.g., less than 1 μm. Accordingly, a wiring gap $d_6$ is set to be also, e.g., less than 1 μm.

As described above, according to the present embodiment, dielectric breakdown of the gate insulation film of the transistor can be precluded not only when the second wiring is formed, but also when the third layer wiring is formed.

The semiconductor device according to the present embodiment can be fabricated by the same method as the method for fabricating the semiconductor device according to the first and the second embodiment and by suitably forming the conductor plugs 72, 76, the wirings 78a, 78b, the dummy wiring 80, etc.

Modifications

The present invention is not limited to the above-described embodiments and can cover other various modifications.

For example, in the first embodiment, the p-contact layer 22 is formed on the p-well 12. However, it is possible not only to form a p-contact layer on a p-well, but also to form an n-contact layer on an n-well. In the latter case, the same advantageous effects as described above can be achieved.

In the first embodiment, the n-contact layer 22 is formed on the p-well 12. However, it is possible that an n-doped layer is formed on the p-well to form n-diodes. P-doped layer may be formed on an n-well to form p-diodes. In all the cases, a potential difference between the well and the gate electrode can be small, whereby dielectric breakdown of the gate insulation film can be precluded.

During the method of fabricating the semiconductor device, one side of the dummy wiring may be connected to a p-well, and the other side of the dummy wiring may be connected to an n-well. However, in this case, the dummy wiring must be finally cut off at an arbitrary position, because when an n-well and a p-well are connected to one dummy wiring, the positive side and the negative side of the electric source are shorted.

What is claimed is:

1. A semiconductor device comprising:

a plurality of first transistors including a first gate electrode formed on a substrate through a first gate insulation film;

a first insulation film formed on the first transistors and the substrate;

a plurality of first wirings formed on the first insulation film, spaced from each other by a first gap; and a second wiring formed on the first insulation film, spaced from either of the first wirings by a second gap which is substantially equal to the first gap, the plurality of the first wirings being electrically connected to the plurality of the first gate electrodes of the plurality of the first transistors, respectively, the second wiring being electrically connected to the substrate without being electrically connected to the first transistors, and the second wiring being for use in electrical connections between the first gate electrodes and the substrate while forming the first wirings and the second wiring by etching a wiring material film.

2. A semiconductor device according to claim 1, wherein the first gap and the second gap are less than 1 μm.

3. A semiconductor device according to claim 1, further comprising:

a plurality of second transistors including a second gate electrode formed on the substrate through a second gate insulation film;

a second insulation film formed on the first insulation film, the first wirings and the second wiring;

a plurality of third wirings formed on the second insulation film, spaced from each other by a third gap; and a fourth wiring formed on the second insulation film, spaced from either of the third wirings by a fourth gap which is substantially equal to the third gap, the plurality of the third wirings being electrically connected to the plurality of the second gate electrodes of the plurality of the second transistors, respectively, the fourth wiring being electrically connected to the substrate without being electrically connected to either of said first and second transistors, and the fourth wiring being for use in electrical connections between the second gate electrodes and the substrate while forming the third wirings and the fourth wiring by etching another wiring material film.

4. A semiconductor device according to claim 3, wherein the third gap and the fourth gap are less than 1 µm.

5. A semiconductor device as recited in claim 1, wherein the second wiring is electrically connected to an impurity region whose conduction type is opposite to a source/drain diffused layer of the first transistor.

6. A semiconductor device comprising:

a plurality of first transistors including a first gate electrode formed on a substrate through a first gate insulation film;

a plurality of second transistors including a second gate electrode formed on the substrate through a second gate insulation film;

a first insulation film formed on the first transistors, the second transistors and the substrate;

a first wiring formed on the first insulation film;

a second insulation film formed on the first wiring and the first insulation film;

a plurality of second wirings formed on the second insulation film, spaced from each other by a first gap;

a third wiring formed on the second insulation film, spaced from either of the second wirings by a second gap which is substantially equal to the first gap;

a third insulation film formed on the second wiring, the third wiring, and the second insulation film;

a plurality of fourth wirings formed on the third insulation film, spaced from each other by a third gap; and a fifth wiring formed on the third insulation film, spaced from either of the fourth wirings by a fourth gap which is substantially equal to the third gap, the plurality of the second wirings being electrically connected to the plurality of the first gate electrodes of the plurality of the first transistors, respectively, the plurality of the fourth wirings being electrically connected to the plurality of the second gate electrodes of the plurality of the second transistors, respectively, the third wiring and the fifth wiring being electrically connected to the substrate without being electrically connected to either of the first and second transistors, the third wiring being for use in electrical connections between the first gate electrodes and the substrate while forming the second wirings and the third wiring by etching a wiring material film, and the fifth wiring being for use in electrical connections between the second gate electrodes and the substrate while forming the fourth wirings and the fifth wiring by etching another wiring material film.

7. A semiconductor device according to claim 6, wherein the first gap, the second gap, the third gap and the fourth gap are less than 1 µm.

8. A semiconductor device as recited in claim 6, wherein the third wiring is electrically connected to a first impurity region whose conduction type is opposite to a source/drain diffused layer of the first transistor, and the fifth wiring is electrically connected to a second impurity region whose conduction type is opposite to a source/drain diffused layer of the second transistor.

* * * * *